United States Patent [19]

Casey

[11] 4,384,919
[45] May 24, 1983

[54] METHOD OF MAKING X-RAY MASKS

[75] Inventor: Martin J. Casey, Lansdale, Pa.

[73] Assignee: Sperry Corporation, New York, N.Y.

[21] Appl. No.: 172,115

[22] Filed: Jul. 25, 1980

Related U.S. Application Data

[63] Continuation of Ser. No. 960,258, Nov. 13, 1978, abandoned.

[51] Int. Cl.³ .................. B44C 1/22; C03C 15/00; C03C 25/06
[52] U.S. Cl. .................... 156/645; 156/657; 250/505.1; 430/5
[58] Field of Search ............... 430/5; 156/654–657, 156/659.1, 661.1, 662, 645, 663; 250/505, 510, 514, 515, 520, 492 R, 492 A; 204/192 E; 427/43; 428/195

[56] References Cited

U.S. PATENT DOCUMENTS

| | | | |
|---|---|---|---|
| 3,742,230 | 6/1973 | Spears et al. | 29/578 X |
| 3,841,930 | 10/1974 | Hetrich | 156/345 X |
| 4,037,111 | 7/1977 | Coquin et al. | 250/505 |
| 4,170,512 | 10/1979 | Flanders et al. | 156/631 |

Primary Examiner—William A. Powell
Attorney, Agent, or Firm—Thomas J. Scott

[57] ABSTRACT

An x-ray mask is made by forming a thin polyimide membrane on a silicon wafer substrate which is then back-etched to form a mask supporting ring of the substrate.

3 Claims, 7 Drawing Figures

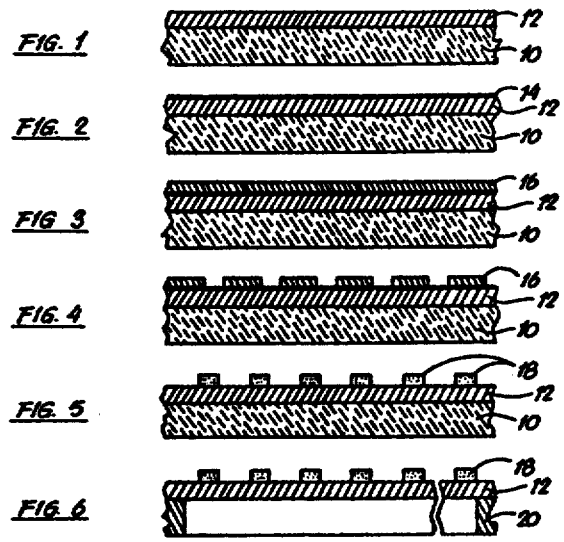
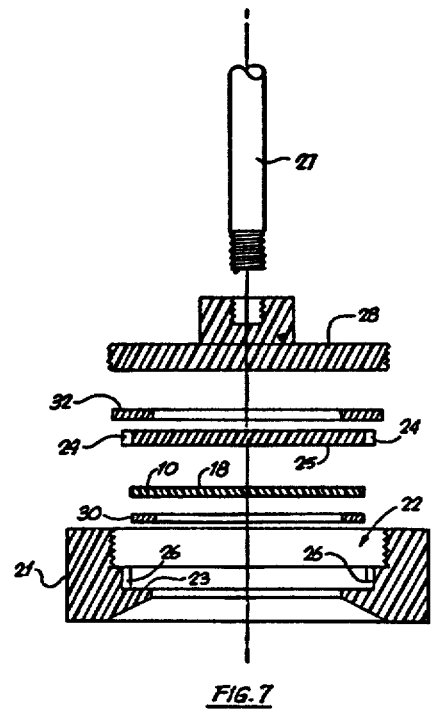

METHOD OF MAKING X-RAY MASKS

This is a continuation of application Ser. No. 960,258, filed Nov. 13, 1978, now abandoned.

BACKGROUND OF THE INVENTION

This invention relates generally to a method for making x-ray masks and the like.

X-ray masks of the type used in fabricating bubble memories must be capable of delineating sub-micron structure in x-ray sensitive resist films in order to produce satisfactory results in x-ray lithography. The thickness of the mask membrane is critical to achieving good results and it is desirable that the mask membrane be as thin as possible. The thickness of the membrane is a compromise between absorption capabilities and mechanical strength. For example, in aluminum radiation, membranes of less than six microns in thickness are utilized. This has led to the development of special techniques for forming and patterning thin, strong mask membranes.

Typically, the pattern to be copied is formed in gold, which is a good absorber of aluminum radiation, and x-ray masks have been fabricated on silicon, Mylar, Kapton and polyimide membranes. Polyimide membranes are desirable because they combine the surface qualities of silicon with the strength of Mylar films and have high transmission quality.

A method for the production of thin polyimide membrane x-ray lithography masks have been disclosed by D. C. Flanders and Henry I. Smith in a paper to be published in the Journal of Vacuum Science and Technology as part of proceedings of the Fourteenth Symposium on Electron, Ion and Photon Beam Technology. According to this process, thin membranes of polyimide are formed by spinning polyamic acid on a glass substrate and polymerizing in situ. The glass substrate acts as a holder and heat sink during formation of gold absorber patterns on the polyimide. A support ring is then bonded to the polyimide and the glass is etched away in dilute hydrofluoric acid. There is thus obtained polyimide membranes with thicknesses of from 0.5–5 microns.

One shortcoming of the method described above is that it involves the transferring and bonding of the membrane to a support frame. These steps subject the very thin membrane to the possibility of mechanical distortion which can impair the accuracy of the mask in use.

SUMMARY OF THE INVENTION

It is a general object of this invention to provide a method for making an x-ray mask or the like of a type having a very thin membrane, which method eliminates the need for transferring and bonding a membrane to a support frame. By eliminating these transfer and bonding steps, the possibility of causing mechanical distortion of the membrane is reduced substantially. Moreover, by following the method of this invention, the membrane is not subjected to mechanical stress once it is formed onto a substrate, as a result of which the distortion problem is minimized. Also, by this method, a uniformly smooth and low defect membrane is produced because a highly polished wafer is used as the host substrate.

The method of this invention comprises the steps of applying a thin coating of a transparent film layer onto the front side of a polished wafer-shaped substrate, forming an absorber pattern on the film layer and etching the substrate from the back side thereof to etch away all but a supporting ring of substrate extending around the peripheral edge of the film layer to form a membrane with the absorber pattern contained thereon.

BRIEF DESCRIPTION OF THE DRAWINGS

FIGS. 1 to 6 illustrate sequential steps in the making of an x-ray mask in accordance with this invention, with FIG. 1 illustrating the spin coating of polyimide onto a silicon wafer;

FIG. 2 illustrating the depositing of a plating base;

FIG. 3 illustrating the applying of a resist;

FIG. 4 illustrating the exposing and developing of the resist;

FIG. 5 illustrating the plating of an absorber pattern and removing of the plating base; and FIG. 6 illustrating the back etching of the wafer to form a supporting ring.

FIG. 7 is a view showing the etching fixture used in the etching step illustrated in FIG. 6.

DETAILED DESCRIPTION OF THE INVENTION

This invention will be described hereinafter as applied to a method of making an x-ray lithography mask. However, it is to be understood that this invention is applicable to the making of other similar masks, such as electron projection masks.

PREFERRED EMBODIMENT

The first step in the fabrication of an x-ray mask according to the method of this invention comprises applying a thin coating of a transparent film layer onto the front side of a rigid wafer-shaped substrate. The substrate comprises a silicon wafer 250–375 microns thick and 51 millimeters in diameter. The front side of the wafer is polished prior to the coating application. Also, a roughened ring is sandblasted around the outer edge of the front side, the rim being 3.0 mm in width. This rim improves the adhesion of the film layer to the front side of the wafer and insures uniform coverage of the wafer by the liquid coating. A set-up for performing the sandblasting step comprises an aluminum jig having a rotating cup for holding a wafer and a top cover which masks the polished side of the wafer except for a 3.0 mm wide rim which is to be sandblasted. This side of the wafer is protected from mechanical damage by an appropriate soft surface tape. The wafer cup and top cover are held in contact and can be rotated during the sandblasting operation. Sandblasting is effected by using an air abrasive machine with 50 micron diameter aluminum oxide powder. After sandblasting, the wafer is cleaned using a standard cleaning procedure.

The coating is a polyimide material, namely, PYRE-ML (RK-692), which is a viscous lacquer of unpolymerized polyamic acid (PYRE-ML (RK-692) is a Trademark of E. I. DuPont de Nemours & Co., Inc., 1007 Market Street, Wilmington, Delaware 19898). In the performance of this step, the lacquer is applied to the polished side of the silicon wafer by spin-coating with a photoresist spinner. By operating the spinner at 3500 rpm a 2.0 micron film layer is produced. The film layer is then dried by baking for 16 hours at +150° C. and polymerized by baking for two hours at 380° C. FIG. 1 illustrates the completion of the first step of this invention with the silicon substrate identified as 10 and the spun polyimide as 12.

The next step in the method of this invention comprises forming an absorber pattern on the polyimide film layer 12. This step involves depositing a plating base of 200 angstroms (A°) chromium and 300 A° gold on the polyimide layer 12 by vacuum evaporation. The chromium-gold plating base is deposited to a thickness of 0.05 microns. FIG. 2 illustrates the condition of the wafer after the plating base 14 has been deposited.

The wafer is then coated with a resist such as polymethylmethacrylate (PMMA) or AZ 1350J, a proprietary product of the Shipley Co., Newton, Massachusetts, to a thickness of about 0.6 microns, this step being illustrated in FIG. 3 with the resist layer identified as 16.

Referring to FIG. 4, an absorber pattern as, for example, in the form of a geometric circuit, is then produced by an appropriate lithographic technique, using either electron beam, x-ray or optical exposure and subsequent development of the resist. The absorber pattern, indicated at 18 in FIG. 5, is formed by electroplating gold using a commercial plating solution. The gold is plated to a thickness of at least 5000° A which is sufficient to absorb ninety percent of the incident x-ray flux during the use of the mask in x-ray lithography. After plating, the thin plating base is removed by ion milling. FIG. 5 illustrates the condition of the mask upon completion of the above-described steps.

The final step in the method of this invention comprises etching the substrate 10 shown in FIG. 5 from the backside thereof to etch away all but a supporting ring 20 of substrate extending around the peripheral edge of the film layer 12 to form a membrane with the absorber pattern contained thereon. The condition of the mask on the completion of the etching step is illustrated in FIG. 6. In this final step of the invention, the etchant used is a 5:3:3 solution of concentrated nitric acid, acetic acid and hydrofluoric acid. The etching step is performed at room temperature.

In order to provide the necessary supporting ring 20 for the membrane, the silicon wafer in FIG. 5 is mounted in a specially designed Teflon (tetrafluoroethylene) etching fixture shown in FIG. 7. The fixture is constructed and arranged and functions to protect the gold absorber pattern 18 and the polyimide silicon interface from attack during etching. A typical substrate is etched in less than 15 minutes. The polyimide film layer 12 is not attacked by the etchant so that non-uniformity in etching does not damage same. The finished membrane is under tension and produces a flat, uniformly taut structure.

The etching fixture is illustrated in FIG. 7 with the individual parts shown in a separated state for the sake of clarity of illustration. The fixture comprises a hollow cylindrical holder 21 having a central bore 22 and an inwardly projecting annular shoulder portion 23 at the lower end thereof. A Teflon disc 25 with a pair of diametrically opposed locking tabs 24 is adapted to be slidably mounted within bore 22 with tabs 24 slidably received in axial cutouts 26 in bore 22. A top cap 28 is constructed to threadedly engage a threaded portion on the upper part of bore 22 above cutouts 26. Top cap 28 is provided with an axially extending support rod 27 for holding the etching fixture in the etching solution.

In the use of the etching fixture a wafer 10 is set into the bore 22 of holder 21 with the absorber pattern facing upwardly, the etching being performed in the horizontal position. A pair of flat annular gaskets 30 and 32 are used on both sides of the wafer 10 as shown in FIG. 7 to seal the peripheral surfaces thereof so as to protect them from attack by the etching solution. To this end, gasket 30 is positioned in sealing contact between shoulder 23 and an annular peripheral surface at the bottom of wafer 10, and gasket 32 is positioned in sealing contact between disc 24 on the top side of wafer 10 and the bottom side of top cap 28. In this manner, during the etching step (performed with wafer 10 in the horizontal position) and when the fixture is immersed in an etching solution, the etchant is sealed from the absorber pattern 18 and from contact with the outer peripheral edge of the bottom side of wafer 10. The Teflon disc 25 is set on top of the wafer 10 and prevents damage to the wafer 10 during the installation of the top cap 28, which step involves the rotation of the top cap 28 into threaded engagement with bore 22. When the top cap 28 is installed it closes the top opening of the bore 22 of holder 21 and encloses the elements shown in FIG. 7 as will be apparent from a consideration of said Figure.

It will be apparent that the fixture is constructed to prevent any leakage of the etching solution onto the topside of the wafer and to prevent chemical attack of the edges of said wafer.

ADDITIONAL EMBODIMENTS

In accordance with another aspect of this invention, an x-ray mask was made by etching a wafer-shaped silicon substrate two inches in diameter for two minutes in buffered hydrofluoric acid to remove any oxide. The substrate was then immediately dehydrated by heating to 200° C. for thirty minutes in an oven. The substrate was removed from the oven and immediately coated with a solution of PYRE-ML (RK-692) by spin coating. The coated substrate was then baked at 200° C. for one hour to drive off solvents and then baked at 400° C. for thirty minutes using an infra-red oven. The coated substrate was then back-etched in a solution of hydrofluoric acid, nitric acid and acetic acid, which solution had an etching rate of 0.04 millimeter per minute. In this etching process a Teflon holder was used to protect the front surface and edges of the wafer. The finished wafer was removed from the Teflon holder and heated to about 150° C. to dry the coating.

In accordance with this invention, it is necessary to make electrical contact with the plating base 14 (FIG. 2). The technique for accomplishing this result is well known in the art and consists of providing openings in the resist 16 (FIG. 3) during the exposure step of the process.

It will be apparent that various modifications can be effected in the subject process as herein described without departing from the scope and spirit of this invention. Thus, for example, substrates other than silicon may be utilized as, for example, glass or quartz. Also, the membrane of this invention may be comprised of transparent films other than polyimides as, for example, polymers of polysulfone or polymers of poly para-xylenes and the like, it being understood that the term "transparent" as used herein is intended to refer to films which possess a transparency of both light rays and x-rays.

Moreover, the absorber pattern herein described may be effected by using various techniques such as ion or plasma etching of a continuous film of the absorber metal.

What is claimed is:

1. The method of making an x-ray mask or the like which comprises the steps of:
   forming a roughened rim around the outside edge of a polished front side of a wafer-shaped mask-supporting substrate;
   applying a thin coating of a transparent film layer directly onto the surface of said front side of said substrate;
   forming an absorber pattern directly on the exposed surface of said film layer; and
   etching said substrate on its backside to etch away all but a supporting ring of substrate extending around the peripheral edge of said film layer so as to form a membrane with the absorber pattern contained thereon.

2. The method according to claim 1 wherein the membrane formed is about two microns thick and said substrate is about 250–375 microns thick.

3. The method according to claim 1 wherein said roughened rim is formed by a sandblasting operation.

* * * * *